(12) United States Patent
Tsunoda

(10) Patent No.: US 7,872,337 B2
(45) Date of Patent: Jan. 18, 2011

(54) SEMICONDUCTOR DEVICE HAVING A FLEXIBLE BOARD FOR CONNECTION TO A SEMICONDUCTOR CHIP MOUNTED ON AN INSULATING SUBSTRATE

(75) Inventor: Tetsujiro Tsunoda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 428 days.

(21) Appl. No.: 11/350,827

(22) Filed: Feb. 10, 2006

(65) Prior Publication Data

US 2006/0244116 A1 Nov. 2, 2006

(30) Foreign Application Priority Data

Apr. 28, 2005 (JP) .............................. 2005-131572
Oct. 4, 2005 (JP) .............................. 2005-290761

(51) Int. Cl.
*H01L 23/02* (2006.01)
(52) U.S. Cl. ....................................... 257/678; 257/666
(58) Field of Classification Search ......... 257/666–677, 257/723–725, 678, E21.515, E23.066, E23.078, 257/E23.189, E25.016, 784, 786, 685, 686, 257/777, 728, 696, 698
See application file for complete search history.

(56) References Cited

U.S. PATENT DOCUMENTS 5,285,107 A * 2/1994 Kazami et al. .............. 257/680
5,313,095 A * 5/1994 Tagawa et al. .............. 257/672
6,060,772 A 5/2000 Sugawara et al.
7,247,929 B2 * 7/2007 Miura et al. ................. 257/675
2009/0008772 A1 1/2009 Apfelbacher et al.

FOREIGN PATENT DOCUMENTS

| DE | 44 07 810 | | 9/1995 | |
|----|-----------|---|--------|---|
| JP | 406177500 | * | 6/1994 | .................. 439/55 |
| JP | 8-97255 | | 4/1996 | |
| JP | 11-177198 | * | 2/1999 | |
| JP | 2002-93995 | | 3/2002 | |
| JP | 2004-87735 | | 3/2004 | |
| JP | 2004-111619 | | 4/2004 | |
| WO | WO 2006/063539 | | 6/2006 | |

* cited by examiner

*Primary Examiner*—Alexander O Williams
(74) *Attorney, Agent, or Firm*—Oblon, Spivak, McClelland, Maier & Neustadt, L.L.P.

(57) ABSTRACT

One of the aspects of the present invention is to provide a semiconductor device, which includes a case, and an insulating substrate provided within the case. It also includes a plurality of semiconductor chips mounted on the insulating substrate, each of which has a first chip electrode for receiving a control signal, and a flexible board supported by the case, which includes a body portion and a plurality of lead portions extending from the body portion. Each of the first chip electrodes is electrically connected with the respective one of the lead portions.

13 Claims, 7 Drawing Sheets

SEMICONDUCTOR DEVICE HAVING A FLEXIBLE BOARD FOR CONNECTION TO A SEMICONDUCTOR CHIP MOUNTED ON AN INSULATING SUBSTRATE

BACKGROUND OF THE INVENTION

1) Technical Field of the Invention

The present invention relates to a semiconductor device, and in particular, relates to the semiconductor device facilitating electrical connection between a control circuit and a semiconductor chip incorporated in the semiconductor device.

2) Description of Related Arts

So far, the semiconductor devices have been utilized in various technical fields. Among them, a power module for supplying a large amount of controlled current to a high power motor attracts intense attention as a key device, for example, from heavy electric machinery industries and automobile industries.

Although not shown herein, the power module includes, in general, a case and an insulating substrate provided within the case. Mounted on the insulating substrate is a power semiconductor chip such as an insulating gate bipolar transistor chip and a freewheel diode chip (which are referred to simply as an "IGBT" chip and a "FWD" chip, respectively). Also, the power module includes a control board having a control circuit for providing a control signal (control current) with the power semiconductor chip, and a plurality of lead frames for leading the controlled current output from the power semiconductor chip in response to the control signals, to an external load such as a motor.

According to the conventional power module, the control board is, in general, a printed-wiring board made of material such as epoxy resin, which is stiff and has a plate-like configuration. The printed-wiring board has at least one control circuit and a plurality of terminal pads electrically connected with the gate electrodes on the IGBT chips via a plurality of conductive wires (metal thin lines). Therefore, the gate signals are supplied from the control circuit to the gate electrode of the IGBT chips, which in turn perform a switching operation in response to the gate signals.

Also, the conventional power module often includes the FWD chip reversely connected with the IGBT chip in parallel, in which an anode electrode of the FWD chip and an emitter electrode of the IGBT chip are electrically connected with the lead frames also via a plurality of the conductive wires. Thus, if four of the conductive wires are used for electrically connecting the emitter electrodes of the IGBT chip and the anode electrodes of the FWD chip with the lead frame, and also four of the conductive wires are used for electrically connecting control electrodes (such as the gate electrode, a current-sensing electrode, and a temperature-sensing electrode) of the IGBT chip with the terminal pads of the control board, eight of the conductive wires are required in total. Also, if the power module has six pairs (three pairs of phase legs, i.e., U-, V-, and W-phases legs) of the IGBT chips and the FWD chips, at least forty-eight of conductive wires are required for achieving the electrical connection to assemble the power module.

Meanwhile, such many conductive wires made by the conventional ultrasonic wire-bonding process require too much time, which costs more and thus prevents the power module from being manufactured at a reasonable cost.

To address this drawback, several techniques have been proposed for facilitating electrical connection between terminal pads. For example, one of the conventional techniques, JPA 2004-111619, discloses a power module in FIG. 1-3, which includes an insulating substrate 4, a second resin circuit board 8 with copper patterns 8$b$ mounted on the insulating substrate 4, a heat sink 3 also provided on the insulating substrate 4, a semiconductor chip (IGBT chip) 1 mounted on the heat sink 3, and a first resin circuit board 5 with copper patterns 5$b$ fixed on the copper patterns 8$b$ of the second resin circuit board 8 by means of solder, in which the chip electrode of the semiconductor chip 1 is electrically connected with the copper pattern 5$b$ of the first resin circuit board 5 via a solder ball and a solder layer. Thus, the first resin circuit board 5 has terminals at both ends connected on the copper patterns 8$b$ of the second resin circuit board 8 and a pair of terminals at the center connected on the chip electrodes (i.e., the gate electrode and the emitter electrode) of the IGBT chip 1.

However, when the first resin circuit board 5 is assembled for connecting the pair of the terminals thereof with the gate and emitter electrodes on the IGBT chip 1 that are closely arranged, both of the terminals and electrodes have to be precisely aligned to each other. Otherwise the gate terminal (or emitter terminal) of the circuit board 5 may bridge (make a short circuit between) the gate and emitter electrodes of the IGBT chip 1. Meantime, the first resin circuit board 5 has a basic substrate made of flexible resin, which is susceptible to ambient temperature. Thus, high temperature while soldering for electrical connection between the terminals of the circuit board 5 and the chip electrodes of the IGBT chip 1 may cause difficulty to align the circuit board 5 to the IGBT chip 1. In other words, misalignment of the circuit board 5 to the IGBT chip 1 may cause connection failure of the short circuit to reduce production yield, on the other hand, precise alignment requires an worker's special caution, which increases assembling time and manufacturing cost.

Further, the copper pattern 5$b$ on the flexible circuit board 5 is a conductive thin layer, of which wiring resistance has a lower limit to be achieved. Therefore, if a large amount of current run between the emitter electrode and the collector electrode of the semiconductor chip as the IGBT chip 1, the copper pattern 5$b$ may be overheated and the flexible circuit board 5 may soften and melt during the switching operation, thereby inhibiting sufficient reliability of the power module during operation.

SUMMARY OF THE INVENTION

Further scope of applicability of the present invention will become apparent from the detailed description given hereinafter. However, it should be understood that the detailed description and specific examples, while indicating preferred embodiments of the invention, are given by way of illustration only, since various changes and modifications within the sprit and scope of the invention will become apparent to those skilled in the art from this detailed description.

One of the aspects of the present invention is to provide a semiconductor device, which includes a case, and an insulating substrate provided within the case. It also includes a plurality of semiconductor chips mounted on the insulating substrate, each of which has a first chip electrode for receiving a control signal, and a flexible board supported by the case, which includes a body portion and a plurality of lead portions extending from the body portion. Each of the first chip electrodes is electrically connected with the respective one of the lead portions.

BRIEF DESCRIPTION OF THE DRAWINGS

The present invention will more fully be understood from the detailed description given hereinafter and accompanying drawings which are given by way of illustration only, and thus are not limitative of the present invention.

DETAILED DESCRIPTION OF THE PREFERRED EMBODIMENTS

Referring to the attached drawings, the details of embodiments according to the present invention will be described hereinafter. In those descriptions, although the terminology indicating the directions (for example, "upper" and "lower") are conveniently used just for clear understandings, it should not be interpreted that those terminology limit the scope of the present invention.

Embodiment 1

Figure 1:
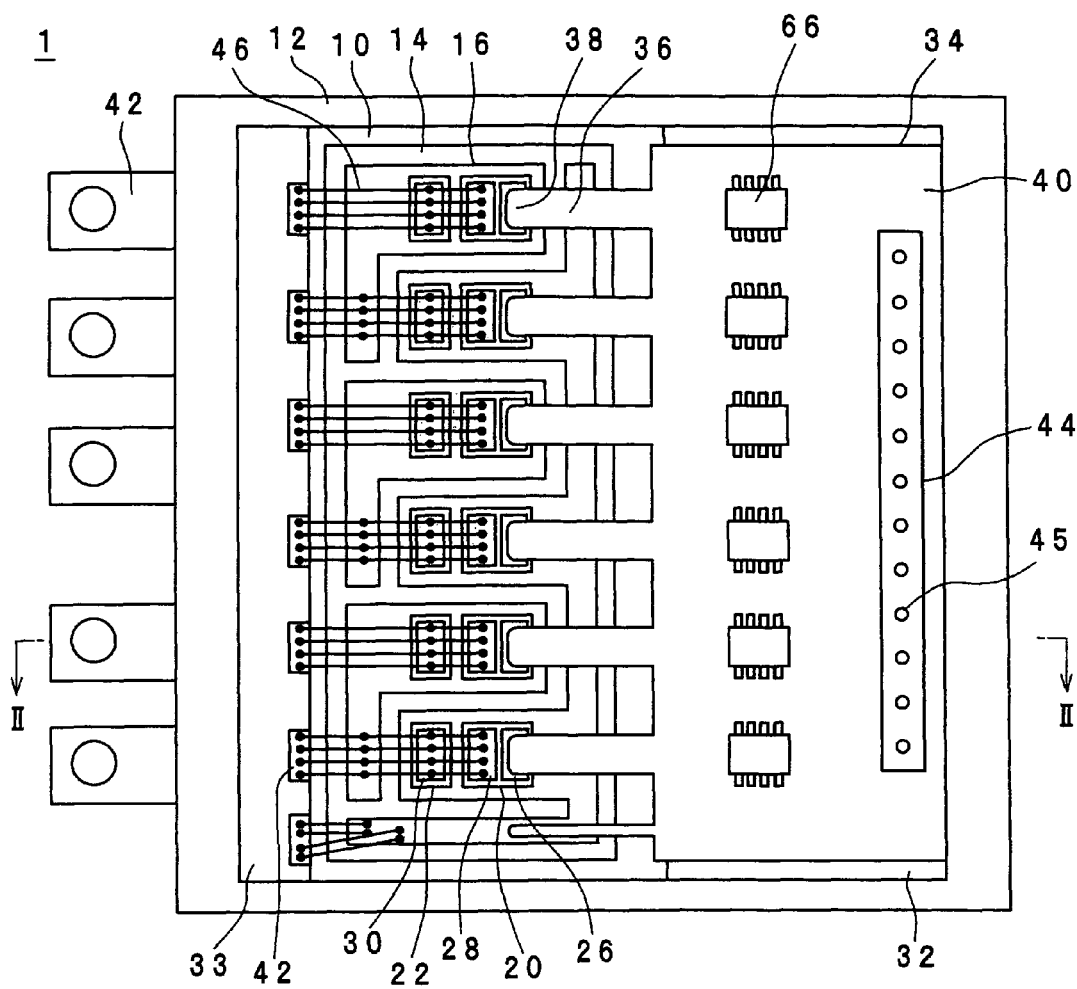
FIG. 1 is a top plan view of a semiconductor device according to the first embodiment of the present invention.
Figure 2:
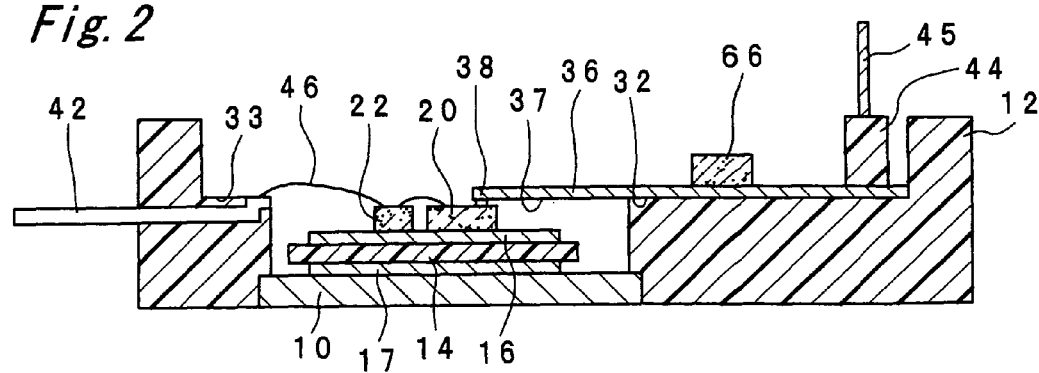
FIG. 2 is a cross sectional view taken along II-II line of FIG. 1.

Referring to FIGS. 1 and 2, a semiconductor device (power module) according to the first embodiment of the present invention will be described herein. The power module 1 of the first embodiment includes, in general, a metal base plate 10 of thermally conductive metal such as copper, and a case 12 of insulating material such as resin, which is fixed on the metal base plate 10.

Also, the power module 1 includes an insulating substrate 14 mounted on the metal base plate 10 via conductive adhesive such as solder. The insulating substrate 14 has patterned thin layers 16, 17 of metal on a pair of main surfaces thereof. Also, mounted on the upper surface of the patterned thin layer 16 is at least one semiconductor chip, which may be, for example, six pairs of the IGBT chips 20 and the FWD chips 22 as illustrated in FIG. 1. Each of the IGBT chips 20 has a control electrode 26 and an emitter electrode 28 on the upper surface, and each of the FWD chips 22 has an anode electrode 30 on the upper surface. The control electrode 26 may include a gate electrode, a current-sensing electrode, and a temperature-sensing electrode.

As illustrated in FIG. 2, the case 12 has a pair of plateau portions 32, 33 substantially at the same level as the upper surfaces of the IGBT chip 20 and the FWD chip 22. Also, the power module 1 of the first embodiment includes a flexible board 34 fixed on the plateau portion 32 closer to the IGBT chip 20, and a plurality of lead frames 42 which are supported on another plateau portion 33 closer to the FWD chip 22 and extend outwardly through the case 12. Thus, the lower surface 37 of the flexible board 34 is arranged substantially flush with the control electrode 26 and the emitter electrode 28 of the IGBT chip 20.

The flexible board 34 of the first embodiment includes a flexible insulating film of polyimide resin and copper patterns formed thereon, and can flexibly be deformed to absorb mechanical stress when being bent and thermal stress at heat-cycling.

Also, the flexible board 34 includes a body portion 40 having substantially rectangular configuration and a plurality of elongated lead portions 36 (six of the lead portions 36 are shown in FIG. 1), each of which has a plurality (e.g., four) of thin tracks of copper (conductive lines or copper patterns) extending on the lower surface 37 of the elongated lead portion 36.

Further, each of the control electrodes 26 of the IGBT chips 20 is electrically connected with the respective terminal of the control IC chip 66 through the tip 38 and the thin track of the lead portion 36. Also, a connector 44 is provided on the flexible board 34 so that the terminals of the control IC chip 66 are connected with an external control circuitry (not shown) via the copper patterns of the flexible board 34 and the pins 45 of the connector 44.

As above, the body portion 40 of the flexible board 34 has a side opposing to the insulating board 14, and the lead portions 36 shown in FIG. 1 extend from the opposing side of the body portion 40. However, not illustrated, the lead portions 36 may extend from any one or more ones of the sides defining the rectangular body portion 40.

Meanwhile, each of the lead frames 42 is electrically connected with the anode electrode 30 of the FWD chip 22 and the emitter electrode 28 of the IGBT chip 20 through conductive thin wires of metal such as aluminum. As above, the IGBT chip 20 and the FWD chip 22 are reversely connected in parallel.

In general, the case 12 is filled up with silicone gel over the insulating substrate 14, the semiconductor chips 20, 22 (IGBT chip and FWD chip), the flexible board 34 and the conductive wires 46, for protection thereof. The power module 1 further includes epoxy resin sealing upper portion of the silicone gel and a cap covering the epoxy resin. However, illustration of the silicone gel, the epoxy resin, and the cap are eliminated for clear understanding of the present invention.

Figure 3:
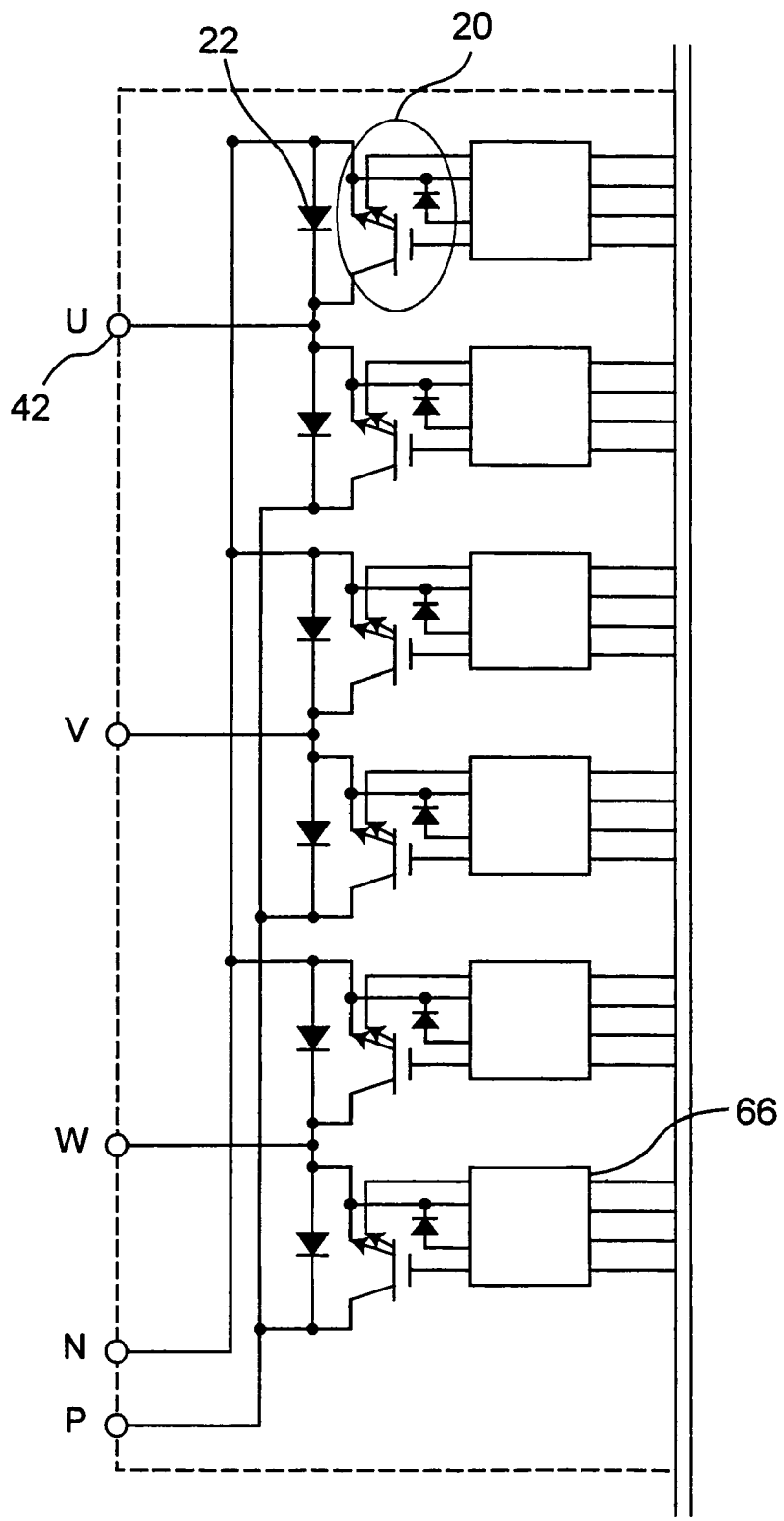
FIG. 3 is a circuit diagram of the semiconductor device of FIG. 1.

With reference to FIG. 3, the circuit diagram of the power module 1 shown in FIGS. 1 and 2 will be described herein. The power module 1 includes three phases (U-, V-, and W-phases) of inverter circuitries, each of which has a lower potential pair of the IGBT 20 and the FWD 22 and an upper potential pair of the IGBT 20 and the FWD 22. For example, drawn at the uppermost in FIGS. 1 and 3 is the lower potential pair of the IGBT 20 and the FWD 22, partially defining the U-phase of the inverter circuitry. Also, illustrated next (beneath) the uppermost one is the upper potential pair of the IGBT 20 and the FWD 22, partially defining the U-phase of the inverter circuitry. Similarly, the pairs of the IGBT 20 and the FWD 22 are subsequently illustrated constituting the V-phase lower potential pair, the V-phase upper potential pair, the W-phase lower potential pair, and the W-phase upper potential pair of the IGBT 20 and the FWD 22.

Also, the lower potential pair of the IGBT 20 and the FWD 22, in each phase of the inverter circuitry, include the emitter electrode 28 and the anode electrode 30, respectively, which are electrically connected via conductive wires 46 with the lead frame 42, which is in turn connected with the negative terminal of a DC power supply (not shown). Further, the upper potential pair of the IGBT 20 and the FWD 22, in each phase of the inverter circuitry, include the collector electrode and the cathode electrode, respectively, which are electrically connected via the same patterned thin layer 16 and also via the conductive wires 46 (drawn at the lowest in FIG. 1) with the lead frame 42, which is in turn connected with the positive terminal of the DC power supply.

Further, in FIG. 3, the patterned thin layer 16 on which the lower potential pair of the IGBT 20 and the FWD 22 are mounted is electrically connected via the conductive wires 46 both with the lead frame 42 and with the emitter electrode 28 and the anode electrode 30 of the corresponding upper potential pair of the IGBT 20 and the FWD 22, respectively. In FIG. 1, while the planner configuration of the lead frame 42 is not illustrated in detail, the lead frame 42 shown at uppermost in FIG. 1 is to be connected with the U-phase load terminal, and the lead frames 42 are subsequently shown at the second and third uppermost as the V-phase and W-phase load terminals, respectively.

It should be noted that, although not shown in FIG. 1, each of the IGBTs 20 includes the control terminal 26 such as the gate electrode, the current-sensing electrode, and the temperature-sensing electrode, which are electrically connected with the control IC chip 66 via cupper pattern on each of the lead portions 36 of the flexible board 34, as illustrated in FIG. 3.

According to the first embodiment, as will be described in detail below, each of the tips 38 of the lead portions 36 can readily be connected with the respective control electrode 26 of the IGBT chip 20 via any connecting means or conductive adhesive such as solder so that the flexible board 34 can electrically be connected with the IGBT chips 20 in a simple and collective manner. This allows the external control circuitry (not shown) to communicate data with the IGBT chip 20 via the pins 45 of the connector 44, the control IC chip 66, and lead portions 36 (and the tips 38 thereof) of the flexible board 34.

To this result, the IGBT chip 20 performs the switching operation in response to the control signals applied to the control electrodes 26, and supplies a large amount of controlled current to the external load, running through the emitter electrodes 28, the conductive wires 46, and the lead frames 42. Thus, according to the present embodiment, since the large amount of controlled current runs through the conductive wires 46 having wiring resistance much less than the thin copper patterns on the flexible board of the above-referenced conventional technique, the conductive wires 46 can be prevented from being overheated so that a reliable power module can be realized.

Also, as described above, since the lower surface 37 of the flexible board 34 is arranged flush with the upper surface of the control electrode 26 and the emitter electrode 28 of the IGBT chip 20, the stress applied to the lead portion 36 can be minimized to improve the reliability of the power module 1.

In addition, the length of the lead portions 36 can reasonably be shortened, thereby to reduce the manufacturing cost.

Embodiment 2

Referring to FIGS. 4 to 8, a semiconductor device according to the second embodiment of the present invention will be described herein. The power module 2 of the second embodiment has components similar to those of the first embodiment except that a plurality elongated lead frames 50 are used instead of the conductive wires 46 of the first embodiment for electrical connection among the emitter electrodes 28 of the IGBT chips 20, the anode electrodes 30 of the FWD chip 22, and the lead frames. Therefore, no duplicate description will be made for the components similar to those of the first embodiment, which are denoted with similar reference numerals.

Figure 5:
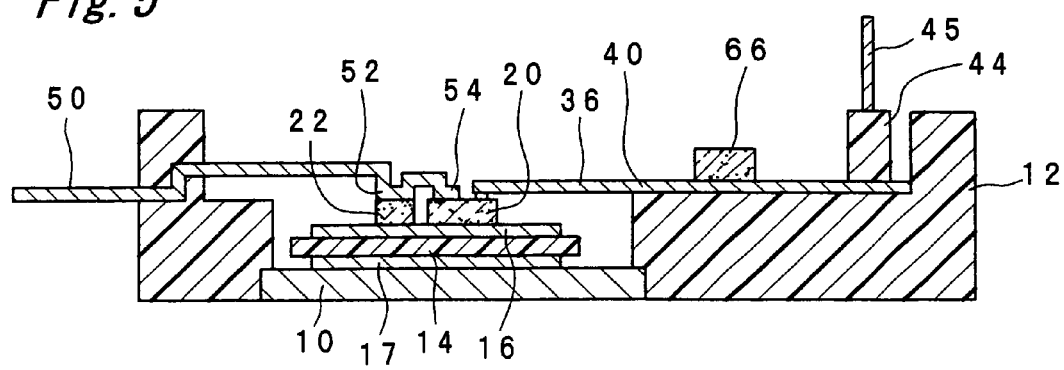
FIG. 5 is a cross sectional view taken along IV-IV line of FIG. 4.
Figure 6:
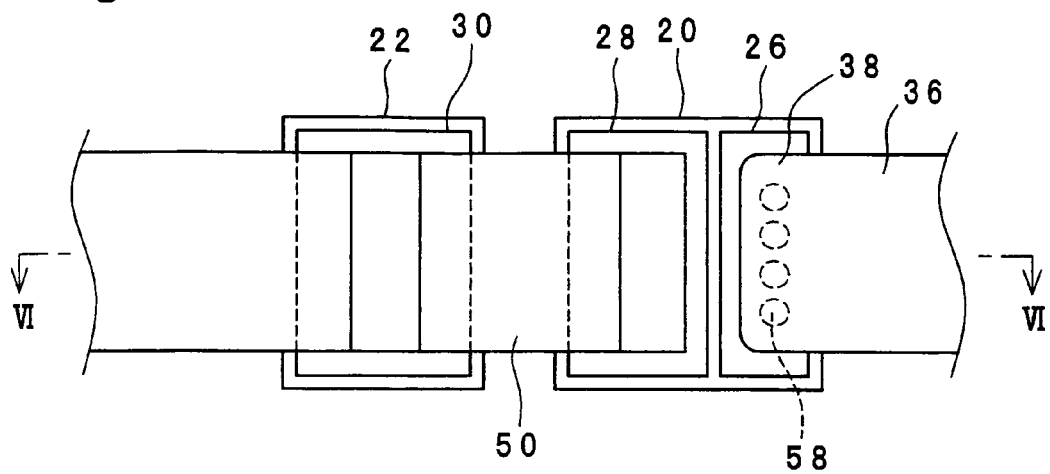
FIG. 6 is an enlarged top plan view illustrating a lead portion of a flexible board, an elongated lead frame, and chip electrodes.

As illustrated in FIG. 5, each of the elongated lead frames 50 of the second-embodiment is supported by the case 12 and extends towards the respective FWD and IGBT chips 22, 20, having bent portions (or protrusions) 52, 54 bent downwardly. Also, as shown in the enlarged views of FIGS. 6 and 7, the bent portions 52, 54 of the lead frame 50 protrude towards the anode electrode 30 and the emitter electrode 28, and electrically connect with the FWD chip 22 and the IGBT chip 20, respectively, by means of conductive adhesive such as solder.

Further, each of the lead portions 36 has a conductive bump 58 at the tip 38 that is electrically connected with the control electrodes 26 of the IGBT chip 20 also by means of conductive adhesive such as solder, which secures electrical connection between the lead portions 36 and the control electrodes 26. The conductive adhesive may be any forms such as conductive paste, besides solder 56, 60.

Figure 7:
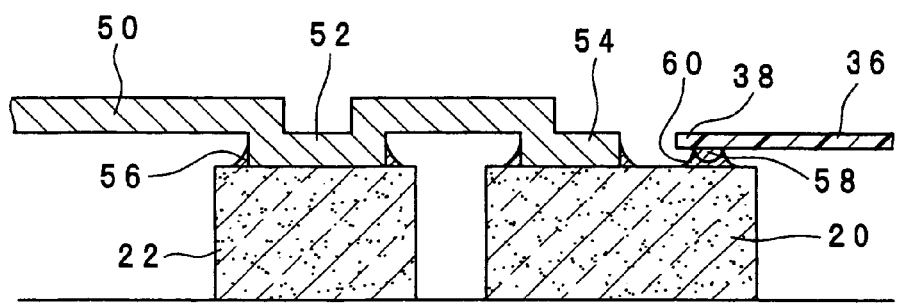
FIG. 7 is a cross sectional view taken along VI-VI line of FIG. 6.
Figure 8:
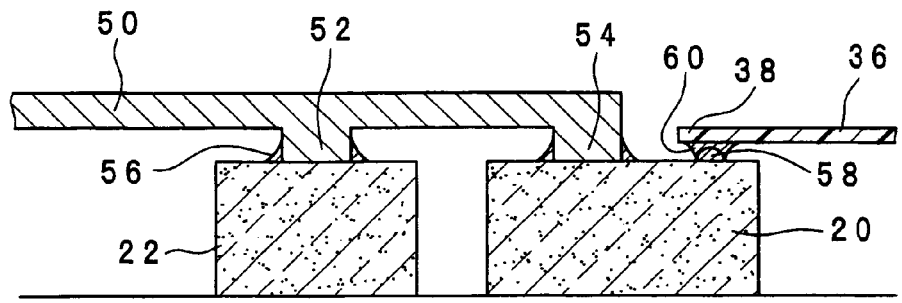
FIG. 8 is a cross sectional view of modification of the second embodiment, similar to FIG. 7.

Instead of the bent portions 52, 54 shown in FIG. 7, each of the lead frames 50 may include the protrusion 52, 54 protruding towards the anode electrode 30 and the emitter electrode 28 as shown in FIG. 8. Alternatively, the conductive bump 58 may be formed on the control electrode 26 rather than on the tip 38 of the flexible board 34.

Figure 4:
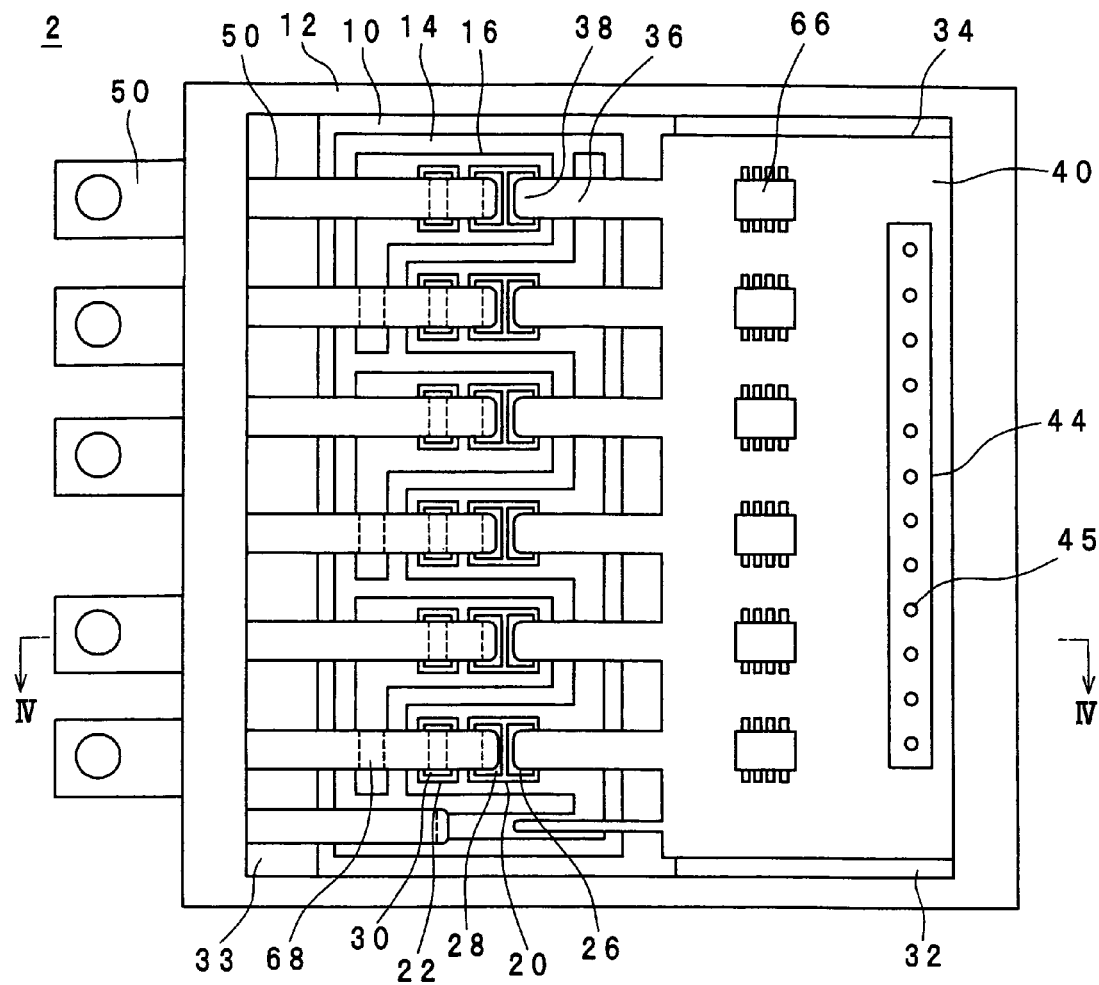
FIG. 4 is a top plan view of a semiconductor device according to the second embodiment of the present invention.

FIG. 4 illustrates three pairs of phases legs of the IGBT chips 20 and the FWD chips 22, each pair defining high and low voltage side of IGBT chips 20 and the FWD chips 22. Thus, in FIG. 4, the second, fourth, and sixth lead frames 50 connecting the emitter electrode and anode electrode of the high voltage side of the IGBT chip and the FWD chip include another bent portions 68, as indicated by a dotted line, protruding to electrically connect with the metal thin layers, on which the low voltage side of the IGBT chips and the FWD chips are bonded. The electrical connection between the bent portion 68 and the metal thin layer 16 may be made by means of any conductive adhesive such as solder.

Therefore, according to the second embodiment, the emitter electrodes 28 of the IGBT chip 20 and the anode electrodes 30 of the FWD chip 22 are electrically bonded with the elongated lead frame 50 in a simple and collective manner. This eliminates necessity of the multiple wire-bonding, thereby reducing the manufacturing cost.

When the IGBT chips 20 perform the switching operation in accordance with the control signals applied to the control electrodes 26, the large amount of current is supplied to the external load through the emitter electrodes 28 and the elongated lead frames 50. Thus, according to the second embodiment, since the large amount of current runs through the elongated lead frames 50 having wiring resistance even less than the conductive wires of the first embodiment, the current path can be prevented from being overheated and disconnected so that the reliability of the power module can be improved.

Embodiment 3

Referring to FIGS. 9 to 12, a semiconductor device according to the third embodiment of the present invention will be described herein. The power module 3 of the third embodiment has components similar to those of the second embodiment except that the lead portions 36 of the flexible board 34 include an elastic member and the plateau portion 32 having a vertical level higher than the upper surfaces of the IGBT and FWD chips 20, 22. Therefore, no duplicate description will be made for the components similar to those of the first embodiment, which are denoted with similar reference numerals.

Figure 9:
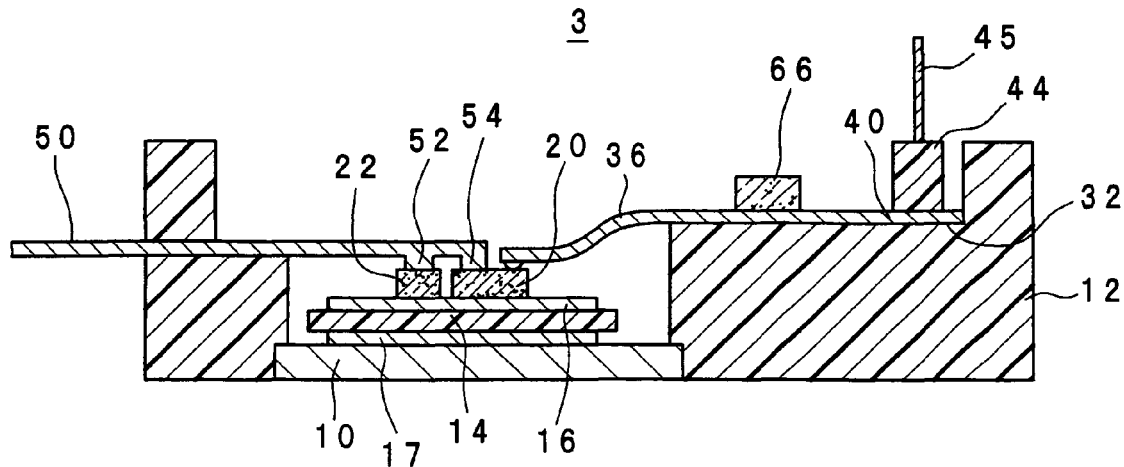
FIG. 9 is a cross sectional view of the semiconductor device according to the third embodiment of the present invention, similar to FIG. 2.
Figure 10A:
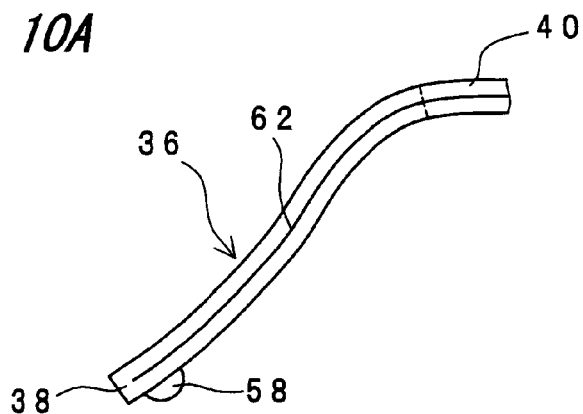
FIGS. 10A and 10B are enlarged cross sectional views illustrating the lead portion of the flexible board before and after being connected to the chip electrode, respectively.
Figure 10B:
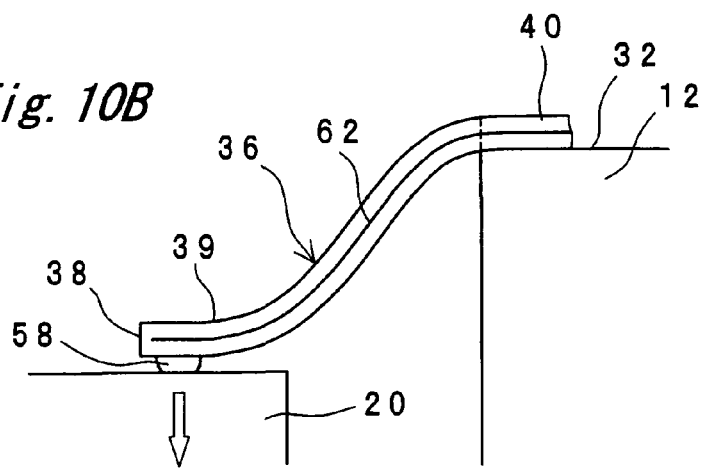

As above, according to the power module 3 as illustrated in FIG. 9, the body portion 40 of the flexible board 34 is positioned at the level higher than the upper surfaces of the IGBT and FWD chips 20, 22. Also, as illustrated in the enlarged views of FIGS. 10A and 10B, the lead portion 36 has the elastic member 62 extending in a longitudinal direction. FIGS. 10A and 10B are cross sectional views before and after the body portion 40 is mounted on the plateau portion 32 of the case 12 and the tip 38 of the lead portion 36 is connected with the control electrode 26, respectively. The elastic member 62 is designed so as to press (bias) the conductive bump 58 at the tip 38 towards the control electrode 26 when the tip 38 of the lead portion 36 is connected onto the control electrode 26. Thus, the elastic member 62 can be any configurations as long as it biases the tip 38 towards the control electrode 26 after being assembled, and for example, it may be a metal thin plate. Also, although FIGS. 10A and 10B show the elastic member 62 encompassed within the lead portion 36, the elastic member 62 may be adhered on the upper surface 39 of the lead portion 36.

Thus, according to the third embodiment, since the elastic member 62 biases the conductive bump 58 at the tip 38 towards the control electrode 26, the lead portion 36 can be connected onto the control electrode 26, without conductive adhesive such as solder, in an easy and collective manner. Also, due to elimination of a thermal treatment process such as a reflow soldering step, the flexible board 34 does not always have to be formed of thermostabile material that is rather expensive, and a more reasonable flexible board can be used, thereby reducing the manufacturing cost. Further, if one of the IGBT chips 20 of the power module 3 has a defect and has to be replaced, no solder used for connection of the control electrode 26 facilitates removing the failed IGBT from the power module 3.

However, it should be noted that another soldering step may be added in order to reinforce the electrical connection between the conductive bump 58 and the control electrode 26 after the conductive bump 58 is biased towards the control electrode 26.

Figure 11:
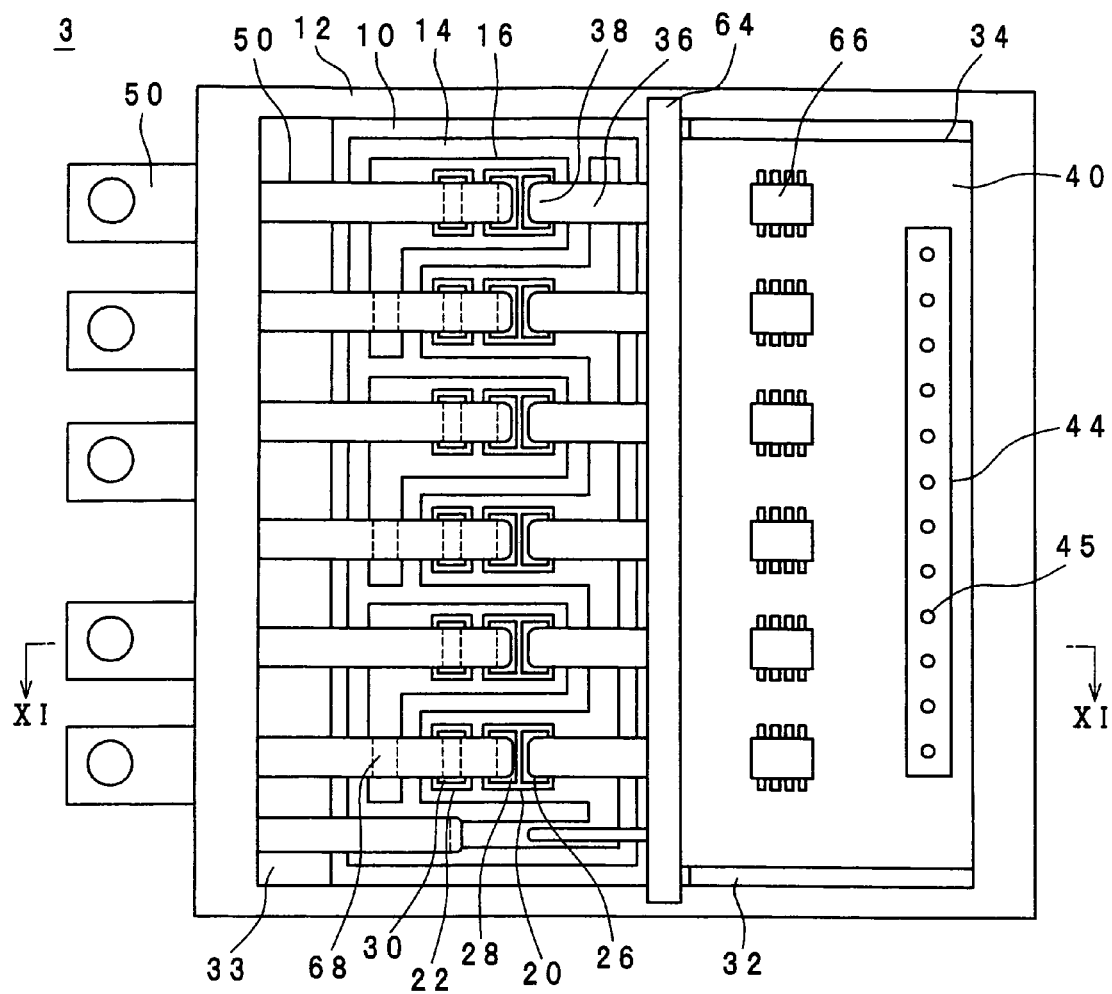
FIG. 11 is a top plan view of modification of the third embodiment, similar to FIG. 4.
Figure 12:
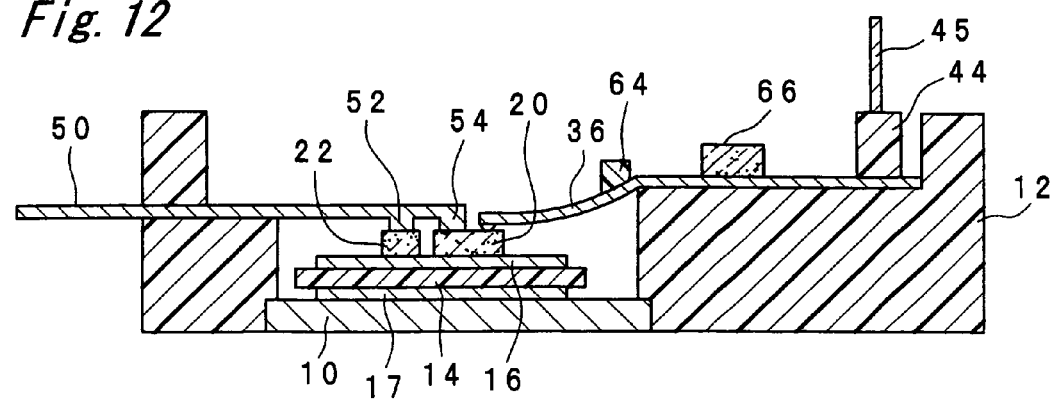
FIG. 12 is a cross sectional view taken along XI-XI line of FIG. 11.

Preferably, as illustrated in FIGS. 11 and 12, a pressing member 64 may be provided on the case 12 for pressing the lead portions 36 of the flexible board 34 towards the IGBT chips 20. Also, while the pressing member 64 is positioned close to the body portion 40 in FIGS. 11 and 12, it may be arranged adjacent the tip 38 of the lead portions 36 or above the conductive bumps 58. The pressing member 64 also facilitates the electrical connection between the conductive bump 58 and the control electrode 26, to obtain the same advantage as the third embodiment.

Embodiment 4

Figure 13:
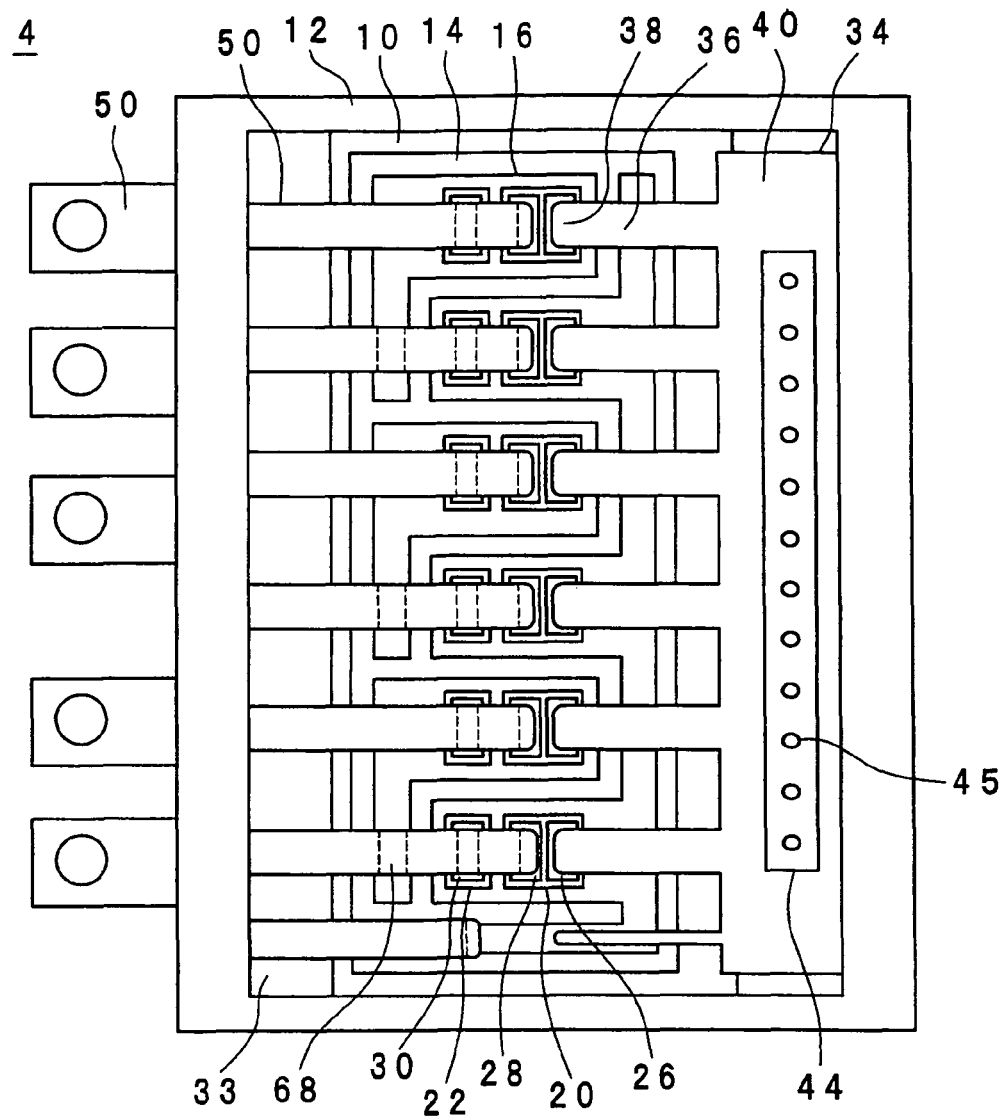
FIG. 13 is a top plan view of the semiconductor device according to the fourth embodiment of the present invention, similar to FIG. 4.
Figure 14:
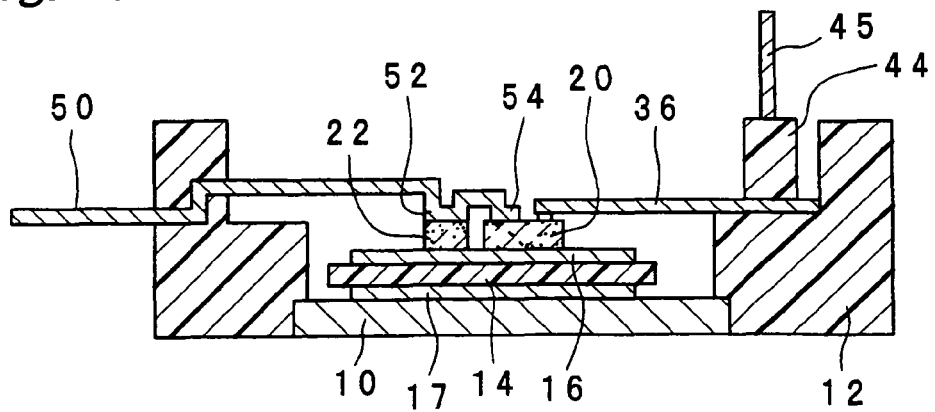
FIG. 14 is a cross sectional view of the semiconductor device according to the fourth embodiment of the present invention, similar to FIG. 5.

Referring to FIGS. 13 and 14, a semiconductor device according to the fourth embodiment of the present invention will be described herein. The power module 4 of the fourth embodiment has components similar to those of the second embodiment except that a control IC chip is not mounted on the body portion 40 of the flexible board 34 for supplying the control signals to the control electrodes 26. Therefore, no duplicate description will be made for the components similar to those of the first embodiment, which are denoted with similar reference numerals.

While the power module 2 of the second embodiment has a plurality of the control IC chips 66, the power module 4 of the fourth embodiment incorporates no control IC chip for supplying control signals to the control electrodes 26, but receives the control signals from an external control circuitry through the connector 44 to the lead portions 36 and the control electrodes 26.

Therefore, according to the fourth embodiment, similar to the aforementioned embodiments, the reliability of the power module 4 can be improved by connecting the tip 38 of the lead portion 36 onto the control electrode 26 of the IGBT chip 20 in an easy and collective manner.

As described above in the first embodiment, the lead portions 36 may be designed to extend from any one or more of the sides defining the rectangular body portion 40. Thus, for example, while FIG. 13 shows the insulating substrate 14 located on the left side of the flexible board 34, another insulating substrate may be provided on the right side of the flexible board 34 and a plurality of the control IC chips 66 may communicate with the control electrodes 26 of the IGBT chips 20 on both sides of the flexible boards. This substantially improves the design flexibility of the power module.

Also, it should be noted that the FWD chip (the second semiconductor chip) 22 is not an essential component and may be eliminated, and the first semiconductor chip 20 may be any other semiconductor chips such as a bipolar Darlington transistor, MOSFET, and a semiconductor chip having a substrate of SiC.

What is claimed is:

1. A semiconductor device, comprising:
   a case;
   an insulating substrate provided within said case;
   a plurality of semiconductor chips mounted on said insulating substrate, each of said semiconductor chips having a first chip electrode for receiving a control signal; and
   a flexible board supported by said case, including a body portion and a plurality of integrally formed lead portions that are arrayed in a first direction and that extend from the body portion in the same plane in a second direction that is substantially perpendicular to the first direction; said body portion and said plurality of lead portions of said flexible board each comprising a flexible insulating film and conductive patterns formed thereon such that at least one of the conductive patterns is formed on each respective one of said plurality of lead portions, the plurality of lead portions being spaced from each other in the first direction such that each lead portion is separated from an adjacent lead portion in the first direction by an open space that is free of the flexible insulating film;

wherein each of the first chip electrodes is electrically connected with one of the conductive patterns on the flexible insulating film in the respective one of the lead portions.

2. The semiconductor device according to claim 1, wherein the first chip electrode and the lead portion are electrically connected by means of solder.

3. The semiconductor device according to claim 2, wherein either one of the first chip electrode and the lead portion has a conductive bump.

4. The semiconductor device according to claim 1, wherein the first chip electrode and the lead portion are electrically connected by pressing the lead portion towards the first chip electrode.

5. The semiconductor device according to claim 4, wherein the lead portion includes a biasing member for biasing the lead portion towards the first chip electrode.

6. The semiconductor device according to claim 4, wherein a pressing member is provided on said case for pressing the lead portion towards the first chip electrode.

7. The semiconductor device according to claim 1, wherein the body portion has rectangular planar configuration defined by four sides, and wherein a plurality of the lead portions extend from any ones of sides of the body portion.

8. The semiconductor device according to claim 1, wherein the flexible board has a lower surface arranged flush with an upper surface of the first chip electrode.

9. The semiconductor device according to claim 1, wherein at least one control circuitry is mounted on the body portion for supplying the control signal to the first chip electrodes.

10. The semiconductor device according to claim 1, wherein said semiconductor chip includes a second chip electrode through which a controlled current is flown, the controlled current being controlled in response to the control signal, and wherein a plurality of elongated lead frames are provided extending out of said case, each of said elongated lead frames electrically connecting with respective one of the second chip electrodes.

11. The semiconductor device according to claim 10, wherein the elongated lead frame has a protrusion for electrically connecting with the second chip electrode.

12. The semiconductor device according to claim 1, wherein each one of said semiconductor chips is an insulating gate bipolar transistor chip, and wherein a plurality of free wheel diode chips are further mounted on said insulating substrate, each one of the free wheel diode chips is reversely connected with respective one of the insulating gate bipolar transistor chips in parallel.

13. The semiconductor device according to claim 1, wherein the plurality of lead portions are separate, rectangular bodies that are spaced from each other in the first direction.

* * * * *